United States Patent [19]
Gilbert

[11] Patent Number: 5,999,062
[45] Date of Patent: Dec. 7, 1999

[54] CRYSTAL OSCILLATOR DRIVER WITH AMPLITUDE CONTROL

[75] Inventor: Barrie Gilbert, Portland, Oreg.

[73] Assignee: Analog Devices, Inc., Norwood, Mass.

[21] Appl. No.: 09/032,228

[22] Filed: Feb. 27, 1998

[51] Int. Cl.[6] ............................................... H03B 5/36
[52] U.S. Cl. .................. 331/116 R; 331/74; 331/108 A; 331/109; 331/160; 331/175; 331/183
[58] Field of Search ...................... 331/74, 109, 116 R, 331/116 FE, 117 R, 117 FE, 117 D, 108 A, 158, 160, 175, 182, 183

[56] References Cited

U.S. PATENT DOCUMENTS 5,770,980  6/1998  Barrett, Jr. et al. ................. 331/160 X

*Primary Examiner*—David Mis
*Attorney, Agent, or Firm*—Marger Johnson & McCollom, P.C.

[57] ABSTRACT

A crystal oscillator drive circuit controls the maximum amplitude of the drive signal to a crystal by limiting the bias current of a gm cell which senses the oscillation amplitude of the crystal. The bias current is commutated by the gm cell responsive to the crystal oscillation. The commuted current is converted to a single-ended current by a current mirror. An output stage converts the current to an output voltage having a voltage swing that is determined by the resistance of a load resistor. The output voltage is then fed back to drive the crystal through a positive feedback path. The output voltage swing and the drive signal to the crystal are limited by the bias current of the gm cell. A fully complementary implementation of the drive circuit includes two complementary gm cells, two current mirrors, and an output stage having two load resistors. The complementary implementation is self biasing from the supply voltage and provides a symmetric topology that reduces crystal loading by cancelling the base currents in the gm cells. Unbalanced current mirrors having high current gain are utilized to provide a wide output voltage swing while reducing crystal loading by reducing the bias currents in the gm cells.

19 Claims, 2 Drawing Sheets

CRYSTAL OSCILLATOR DRIVER WITH AMPLITUDE CONTROL

BACKGROUND OF THE INVENTION

This invention relates generally to crystal oscillators, and more particularly, to an oscillator drive circuit having amplitude control.

Oscillators based on quartz crystals are widely used to provide stable timing signals for electronic circuits. Quartz crystals are passive components, so they must be actively driven to produce a useable signal. However, overdriving a crystal results in mechanical flexures within the crystal which reduce its accuracy. Overdriving also causes unnecessary power dissipation which results in errors due to accelerated aging.

Therefore, there is a need for a crystal oscillator drive circuit which provides precise amplitude control so as to maintain the accuracy of the crystal.

SUMMARY OF THE INVENTION

A crystal oscillator drive circuit constructed in accordance with the present invention provides precise and accurately controllable drive to a crystal in a simple, compact circuit, while minimizing the loading of the crystal, thereby maximizing the quality factor "Q" of the crystal.

An object of the present invention is to accurately control the drive signal to a crystal oscillator.

Another object of the present invention is to minimize the drive signal to a crystal oscillator.

A further object of the present invention is minimize the loading of a crystal oscillator.

The present invention achieves these objectives by utilizing a gm cell having a limited peak output current to sense the voltage across the crystal, and then using a resistor to convert the output current into a voltage signal which is fed back to the input to drive the crystal. Because the peak value of the output current from the gm cell is limited, so to is the amplitude of the drive signal to the crystal.

In a fully complementary embodiment, the drive circuit includes two complementary gm cells, two current mirrors, and an output stage having two load resistors. The complementary implementation is self biasing from the supply voltage and provides a symmetric topology that reduces crystal loading by cancelling the base currents in the gm cells. Unbalanced current mirrors having high current gain are utilized to provide a wide output voltage swing while reducing crystal loading by reducing the bias currents in the gm cells.

One aspect of the present invention is a drive circuit for a crystal oscillator comprising: a gm cell for generating a current responsive to the oscillation amplitude of the crystal; a resistor coupled to the gm cell for converting the current to a voltage; and a feedback path coupled between the resistor and the gm cell for driving the crystal responsive to the voltage. The current generated by the gm cell is limited so as to limit the drive to the crystal. The drive circuit can also include: a second gm cell coupled to the first gm cell for generating a second current responsive to the oscillation amplitude of the crystal; and a second resistor coupled to the second gm cell and the first resistor for converting the second current to a second voltage.

Another aspect of the present invention is a drive circuit for a crystal oscillator comprising: a first terminal for coupling the drive circuit to a crystal; a second terminal for providing an output signal; a first gm cell coupled to the first terminal for generating a first differential current responsive to the oscillation amplitude of the crystal; a first current mirror coupled to the first gm cell for converting the first differential current to a first single-ended current; a first resistor coupled between the first current mirror and the second terminal for generating a first voltage responsive to the first single-ended current; and a feedback resistor coupled between the first and second terminals for driving the crystal.

A further aspect of the present invention is a method for driving a crystal oscillator comprising: generating a current responsive to the oscillation amplitude of the crystal; converting the current to a voltage; and feeding the voltage back to the crystal, thereby driving the crystal. The method can further include limiting the current, thereby limiting the drive to the crystal.

An advantage of the present invention is that it provides a simple, compact oscillator drive circuit that maintains a very accurate amplitude of oscillation.

Another advantage of the present invention is that it allows the amplitude of oscillation of a crystal oscillator can be accurately determined by the selection of resistive component values.

The foregoing and other objects, features and advantages of the invention will become more readily apparent from the following detailed description of a preferred embodiment of the invention which proceeds with reference to the accompanying drawings.

DETAILED DESCRIPTION

Figure 1:
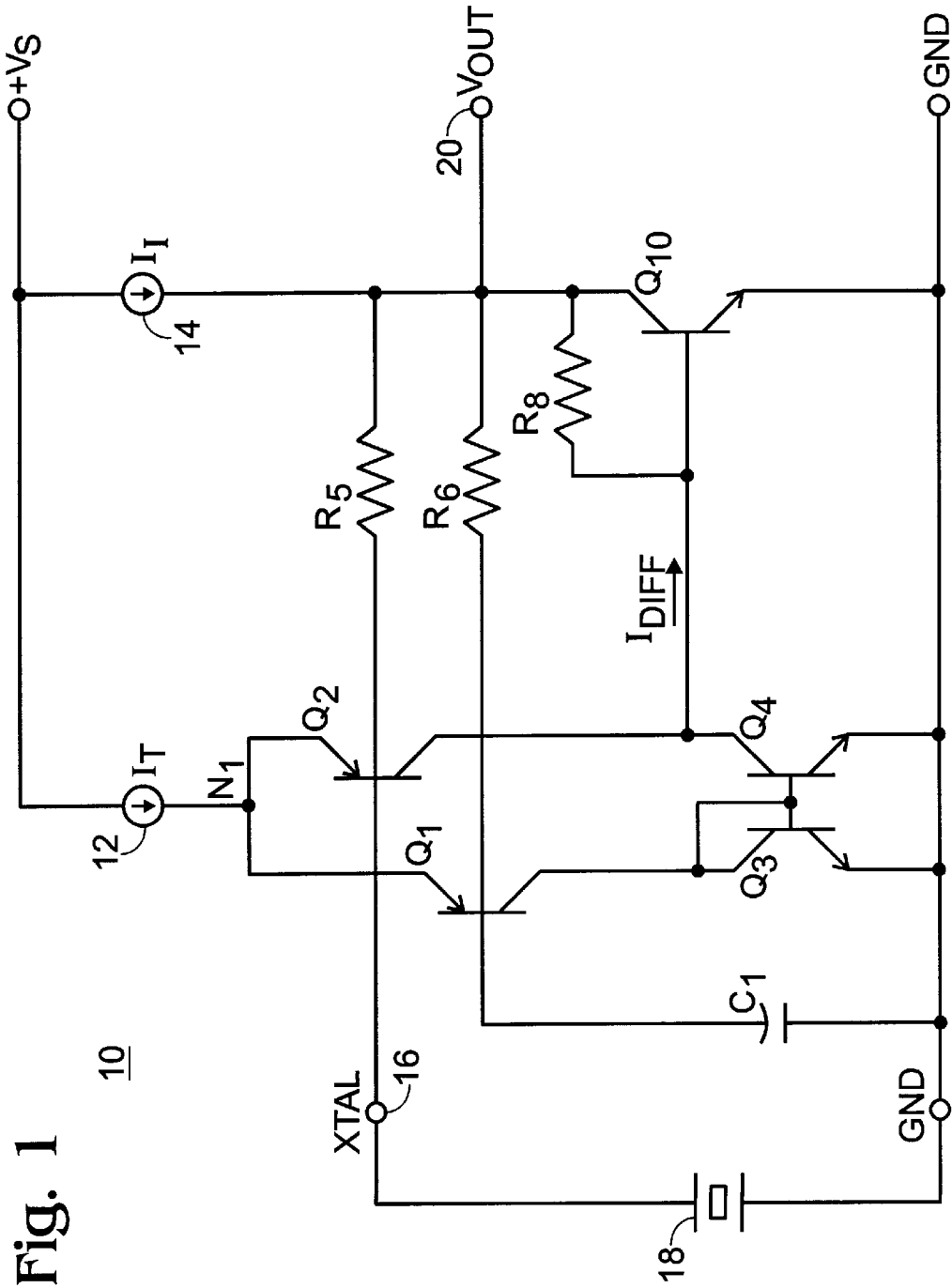
FIG. 1 is schematic diagram of a first embodiment of a crystal oscillator drive circuit constructed in accordance with the present invention.

A first embodiment of a crystal oscillator drive circuit constructed in accordance with the present invention is shown generally at 10 in FIG. 1. The drive circuit 10 includes a transconductance ("gm") cell comprised of PNP transistors Q1 and Q2 and current source 12, and a current mirror comprised of NPN transistors Q3 and Q4. Transistor Q1 has an emitter connected to a node N1, a collector connected to the collector of Q3, and a base coupled to a power supply ground terminal GND through a capacitor C1. Transistor Q2 has an emitter connected to node N1, a collector connected to the collector of Q4, and a base connected to a terminal 16 which couples the drive circuit 10 to a crystal 18. The crystal oscillator signal XTAL is produced at terminal 16. The emitters of current mirror transistors Q3 and Q4 are connected to GND, and their bases are commonly connected to the collector of Q3. The current source 12 is connected between node N1 and a positive power supply terminal $+V_s$.

The drive circuit 10 also includes a current-to-voltage converter output stage comprising NPN transistor Q10, resistor R8 and current source 14. Transistor Q10 has an emitter connected to GND, a base connected to the collector of Q4 and a collector connected to a terminal 20 for providing an output voltage $V_{OUT}$. Resistor R8 is connected between the base and collector of Q10, while current source 14 is connected between the positive power supply terminal $+V_s$ and terminal 20 so as to bias transistor Q10 with bias current $I_1$.

A feedback resistor R5 is connected between the XTAL terminal 16 and the output terminal 20. Another resistor R6 is connected between the base of Q1 and the output terminal 20.

The operation of the crystal oscillator drive circuit 10 will now be described with reference to FIG. 1. The crystal 18, which is connected between the XTAL terminal 16 and GND, can be modeled as a very high Q parallel resonator. Current source 12 provides a bias ("tail") current $I_T$ to the differential pair of transistors Q1 and Q2 which commutate the tail current between Q1 and Q2 in response to the oscillations of the crystal 18, thereby generating a differential current at the collectors of Q1 and Q2. The current mirror formed by Q3 and Q4 convert the differential current into a single-ended difference current $I_{DIFF}$ which flows through resistor R8. The maximum voltage swing in $V_{OUT}$ that can be obtained from the circuit is $\pm I_T R8$. Thus, the maximum voltage swing is determined by the bias arrangements of the gm cell and output stage. Since the output voltage swing is limited by the tail current, so to is the drive to the crystal, and therefore, errors due to crystal overdrive are eliminated.

Resistor R6 forms a type of negative feedback path, while R5 forms a positive feedback path. They do not provide true positive and negative feedback in the traditional sense because the resistors couple the output to both inputs of the differential amplifier formed by Q1 and Q2. Thus, there is no differential signal generated at the inputs of the differential amplifier as a result of variations in the output voltage $V_{OUT}$. Resistor R6 establishes the common mode voltage at the input to the differential amplifier, and the feedback path through R5 excites the crystal. The capacitor C1 blocks AC feedback from the output, so there is a net positive regeneration around the loop that includes R5.

If resistor R8 were replaced with a capacitor, the gm cell, current mirror, and output stage would function in a manner similar to a classic operational amplifier, and an external feed back path (outer control loop) would then be required to control the oscillator amplitude. However, by placing the resistor R8 in the inner control loop, the present invention provides a simple, and accurate control circuit without the delays associated with operational amplifiers (which behave as integrators). The voltage swing at the output can be well controlled by the choice of tail current for the gm cell and the value of R8.

In a practical implementation, a tuning circuit (typically including a varactor diode and resistive matrix for interfacing to an automatic frequency control signal) would also be coupled to the crystal. Such a tuning circuit is disclosed in co-pending U.S. patent application Ser. No. 09/032,436, filed Feb. 27, 1998 entitled "Cubic-Type Temperature Function Generator With Adjustable Parameters", which is herein incorporated by reference.

To adjust the center voltage of the output voltage $V_{OUT}$, an additional current can be forced into R8. One way to accomplish this is to connect a current source between the base of Q10 and GND. Another technique is to force an additional current into the collector of Q3. Alternatively, the relative emitter areas of Q3 and Q4 can be adjusted to provide a net offset current into R8.

Figure 2:
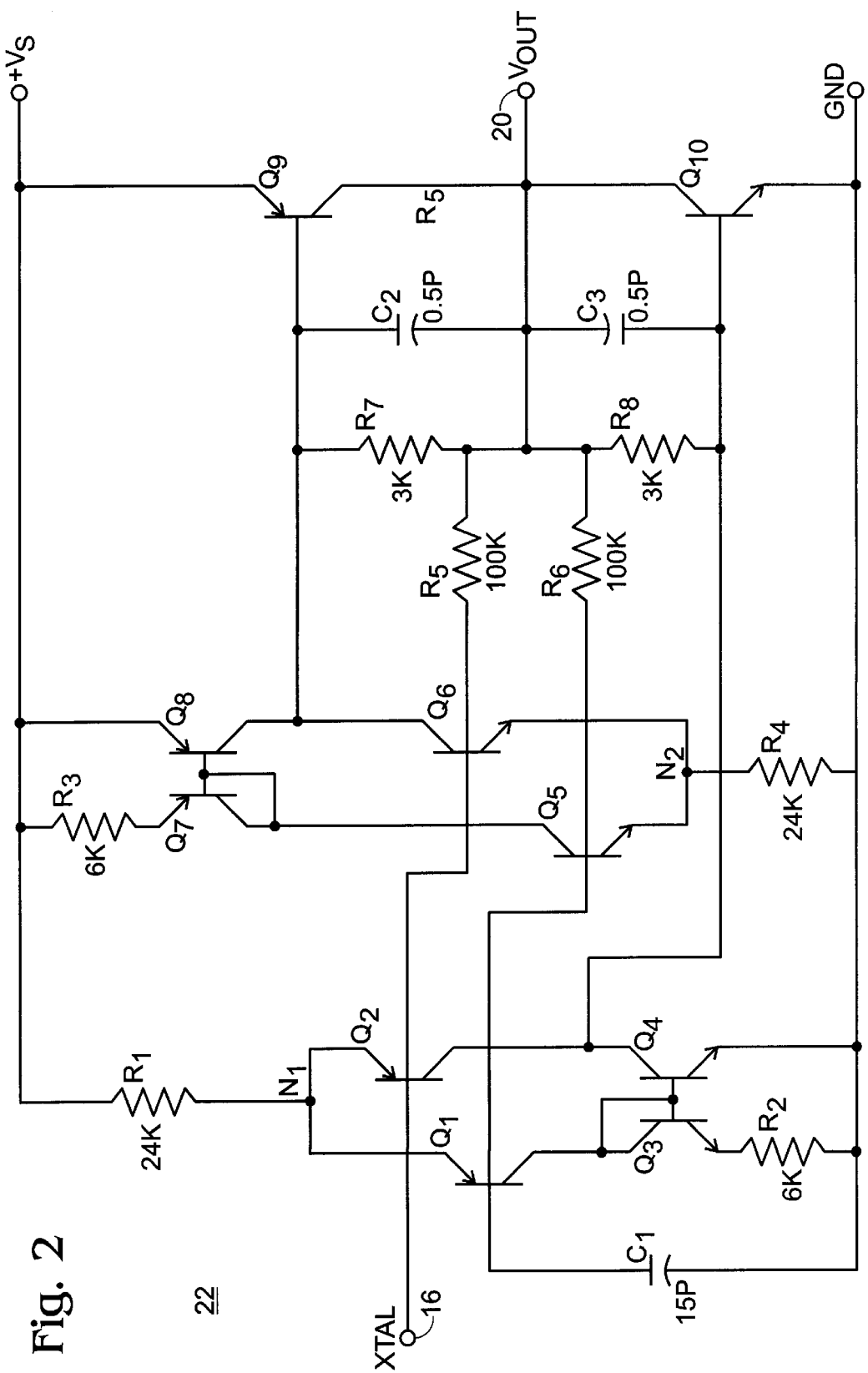
FIG. 2 is schematic diagram of a second embodiment of a crystal oscillator drive circuit constructed in accordance with the present invention.

A second embodiment of a crystal oscillator drive circuit constructed in accordance with the present invention is shown generally at 22 in FIG. 2. Component values for a practical implementation are also shown. The drive circuit 22 includes all of the same components of the circuit of FIG. 1 except for the exceptions noted below, and the same reference designators are used to refer to the components corresponding to those shown in FIG. 1.

Referring to FIG. 2, current source 12 of FIG. 1 is implemented as a resistor R1. The current source 14 of FIG. 1 is replaced by a PNP transistor Q9 which has an emitter connected to the positive power supply terminal $+V_s$ and a collector connected to the output terminal 20. A further difference is that a resistor R2 is connected between the emitter of Q3 and GND.

The circuit of FIG. 2 is fully complementary version of the circuit of FIG. 1, and as such, it also includes a second gm cell comprised of NPN transistors Q5 and Q6 and a current source implemented as resistor R4. It also includes a second current mirror comprised of PNP transistors Q7 and Q8. Transistor Q5 has an emitter connected to a node N2, a collector connected to the collector of Q7, and a base coupled to the base of Q1. Transistor Q6 has an emitter connected to node N2, a collector connected to the collector of Q8, and a base connected to the base of Q2. The emitter of current mirror transistor Q7 is coupled to $+V_s$ through a resistor R3, and the emitter of transistor Q8 is connected to $+V_s$. The bases of Q7 and Q8 are commonly connected to the collector of Q7. The resistor R4 is connected between node N2 and GND.

The drive circuit 22 also includes a second output stage comprising PNP transistor Q9 and resistor R7. Transistor Q9 has an emitter connected to $+V_s$, a base connected to the collector of Q8, and a collector connected to terminal 20. Resistor R7 is connected between the base and collector of Q9.

Some of the aspects of the operation of the circuit of FIG. 2 are the same as those of FIG. 1. For example, resistors R5 and R6 in FIG. 2 form the same feedback arrangement as the corresponding components of FIG. 1. Likewise, capacitor C1 performs the same function of blocking the AC feedback from the output. However, there are numerous differences in the operation of the second embodiment of the crystal oscillator drive circuit 22 will now be described with reference to FIG. 2.

One aspect of the operation of the drive circuit 22 is that it is self-biasing from the power supply. The complementary symmetry of the circuit causes the bases of Q1 and Q2 to settle at the mid-point of the supply. Thus, the common emitters of Q1 and Q2 at node N1 settle at about 700 mV above the mid-point of the supply. This in turn, establishes a bias current in R1. The bias current through Q5 and Q6 is likewise determined by the value of R4, since node N2 settles at about 700 mV below the mid-point of the supply. The biasing of the output stage is determined by the current path that starts at $+V_s$, runs through the emitter of Q9, through R7 and R8, and through Q10 to GND. The center voltage of the output signal $V_{OUT}$ is also one-half of the supply voltage.

Another aspect of the fully complementary design of the circuit of FIG. 2 is that the output stage can provide rail-to-rail operation if large voltage swings are required.

A further aspect of the fully complementary design is that the symmetry of the circuit reduces the amount of base current flowing through feedback resistors R5 and R6. This is important because resistors R5 and R6 load the crystal, and one of the objectives of the invention is to minimize the crystal loading so as to maximize its Q. Therefore, the impedances of R5 and R6 need to be kept as high as possible. The circuit of FIG. 2 reduces the current through resistor R5 because, to a first order approximation, the base current of Q2 is cancelled by the base current of Q6 since they are opposite polarity devices. Thus, only a very small base current flows in R5, and its resistance can be kept relatively high. Likewise, the base currents of Q1 and Q5 cancel to first approximation, so the current through R6 is reduced. Thus, the symmetric structure of the circuit of FIG. 2 automatically provides a high degree of balance.

To further minimize the base currents, and thus, the loading of the crystal, the bias currents (tail currents) in R1 and R4 must be kept relatively low. However, the amplitude of the oscillation appearing at the output is determined by the tail currents available in the two gm cells Q1–Q2 and Q5–Q6 which are then transferred through current mirrors Q3–Q4 and Q7–Q8 into what can be viewed as load resistors R7 and R8. The output voltage swing appearing across R7 and R8 is whatever peak current is available from the mirrors multiplied by the value of the resistors. If the mirrors were 1:1 current mirrors, then the current being replicated would be limited to the tail current. Therefore, if the tail current is kept low to reduce the base currents in the gm cells, very large resistor values would be required to provide an adequate output voltage swing. However, it is desireable to run transistors Q9 and Q10 at fairly high collector currents, so their base currents are substantial, and smaller resistance values are needed.

To solve this problem, resistors R2 and R3 unbalance the current mirrors in such a way that the peak output from the mirrors is much higher than the input current. If the circuit of FIG. 2 is operated from a 3-volt supply, the tail currents in R1 and R4 are approximately 25 microamps, which is low enough to keep the base currents in the gm cells relatively low. However, the non-linear unbalance in the current mirrors produces about 220 microamps of current through Q4 and Q8 which is enough to allow R7 and R8 to be made relatively small while still providing adequate output voltage swing. In the example of FIG. 2, the output swing is about ±600 mV (1 volt peak-to-peak), and the drive to the oscillator is about ±100 mV, which is low enough to provide good accuracy.

The final amplitude is very well controlled by the selection of resistor values which determine the tail currents through the gm cells, the gain of the current mirrors, and the voltage swing across R7 and R8. Thus, the circuit of FIG. 2 provides a compact, well-balanced circuit that provides excellent amplitude control, and large output voltage swing without overdriving the crystal. The high current gain of the current mirrors allows the use of small output resistors while still maintaining low tail currents, low base currents, and light crystal loading. The symmetry of the circuit further reduces base currents and crystal loading and provides an output signal that is inherently centered at the mid-point of the supply voltage.

When the circuit of FIG. 2 is used to drive a crystal, a resistor is typically connected across the crystal to set up the attenuation ratio between the output signal $V_{OUT}$, which can have about ±600 mV of swing and the actual voltage across the crystal, which preferably is about ±100 mV to avoid overdriving the crystal. This parallel resistor does not actually shunt the crystal, but rather, the active feedback nature of the drive circuit causes the resistance to be cancelled by the positive feedback.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A drive circuit for a crystal oscillator comprising:
    a transconductance cell for generating a current responsive to the oscillation a amplitude of the crystal;
    a resistor coupled to the transconductance cell for converting the current to a voltage;
    a first feedback path coupled between the resistor and the transconductance cell for driving the crystal responsive to the voltage; and
    a second feedback path coupled between the resistor and the transconductance cell for establishing a common mode voltage at the transconductance cell.

2. A drive circuit according to claim 1 wherein the current generated by the transconductance cell is limited.

3. A drive circuit for a crystal oscillator comprising:
    a transconductance cell for generating a current responsive to the oscillation amplitude of the crystal;
    a resistor coupled to the transconductance cell for converting the current to a voltage;
    a feedback path coupled between the resistor and the transconductance cell for driving the crystal responsive to the voltage;
    a second transconductance cell coupled to the first transconductance cell for generating a second current responsive to the oscillation amplitude of the crystal; and
    a second resistor coupled to the second transconductance cell and the first resistor for converting the second current to a second voltage.

4. A drive circuit according to claim 3 wherein the second current generated by the second transconductance cell is limited.

5. A drive circuit for a crystal oscillator comprising:
    a first terminal for coupling the drive circuit to a crystal;
    a second terminal for providing an output signal;
    a first transconductance cell coupled to the first terminal for generating a first differential current responsive to the oscillation amplitude of the crystal;
    a first current mirror coupled to the first transconductance cell for converting the first differential current to a first single-ended current;
    a first resistor coupled between the first current mirror and the second terminal for generating a first voltage responsive to the first single-ended current;
    a feedback resistor coupled between the first and second terminals for driving the crystal and
    a second feedback resistor coupled between the second terminal and the first transconductance cell for establishing a common mode voltage at the first transconductance cell.

6. A drive circuit according to claim 5 further including a first current source coupled to the first transconductance cell for providing a first bias current thereto.

7. A drive circuit according to claim 6 wherein the first bias current is limited.

8. A drive circuit according to claim 5 wherein the first current mirror is unbalanced such that the output from the first current mirror is higher than the input to the first current mirror.

9. A drive circuit according to claim 8 wherein the first current mirror includes a first current mirror resistor for unbalancing the first current mirror.

10. A drive circuit according to claim 5 further including a transistor having a first terminal coupled to the first current mirror, a second terminal coupled to the second terminal of the drive circuit, and a third terminal coupled to a power supply terminal.

11. A drive circuit for a crystal oscillator comprising:

a first terminal for coupling the drive circuit to a crystal;

a second terminal for providing an output signal;

a first transconductance cell coupled to the first terminal for generating a first differential current responsive to the oscillation amplitude of the crystal;

a first current mirror coupled to the first transconductance cell for converting the first differential current to a first single-ended current;

a first resistor coupled between the first current mirror and the second terminal for generating a first voltage responsive to the first single-ended current;

a feedback resistor coupled between the first and second terminals for driving the crystal;

a second transconductance cell coupled to the first terminal for generating a second differential current responsive to the oscillation amplitude of the crystal;

a second current mirror coupled to the second transconductance cell for converting the second differential current to a second single-ended current; and a second resistor coupled between the second current mirror and the second terminal for generating a second voltage responsive to the second single-ended current.

12. A drive circuit according to claims 11 further including a second current source coupled to the second transconductance cell for providing a second bias current thereto.

13. A drive circuit according to claim 12 wherein the second bias current is limited.

14. A drive circuit according to claim 11 further including a second feedback resistor coupled between the second terminal and the first transconductance cell for establishing a common mode voltage at the first transconductance cell.

15. A drive circuit according to claim 14 further including:

a first transistor having a first terminal coupled to the first current mirror, a second terminal coupled to the second terminal of the drive circuit, and a third terminal coupled to a first power supply terminal; and a second transistor having a first terminal coupled to the second current mirror, a second terminal coupled to the second terminal of the drive circuit, and a third terminal coupled to a second power supply terminal.

16. A method for driving a crystal oscillator comprising:

generating a current responsive to the oscillation amplitude of the crystal using a differential amplifier;

generating a voltage responsive to the current;

providing positive feedback to the crystal oscillator responsive to the voltage, thereby driving the crystal; and providing negative feedback to the differential amplifier responsive to the voltage.

17. A method according to claim 16 further including limiting the current, thereby limiting the drive to the crystal.

18. A method for driving a crystal oscillator comprising:

generating a current responsive to the oscillation amplitude of the crystal;

generating a voltage responsive to the current;

providing positive feedback to the crystal oscillator responsive to the voltage, thereby driving the crystal;

generating a second current responsive to the oscillation amplitude of the crystal;

generating a second voltage responsive to the second current; and combining the first and second voltages.

19. A method according to claim 18 further including limiting the second current.

* * * * *

UNITED STATES PATENT AND TRADEMARK OFFICE
CERTIFICATE OF CORRECTION

PATENT NO. : 5,999,062
DATED : December 7, 1999
INVENTOR(S) : Barrie Gilbert

It is certified that error appears in the above-identified patent and that said Letters Patent is hereby corrected as shown below:

Column 1,
Line 31, "invention is minimize" should read -- invention is to minimize --.

Column 2,
Line 32, "FIG. 1 is schematic" should read -- FIG. 1 is a schematic --.
Line 35, "FIG. 2 is schematic" should read -- FIG. 2 is a schematic --.

Column 3,
Line 39, "feed back" should read -- feedback --.

Column 4,
Line 10, "FIG. 2 is fully" should read -- FIG. 2 is a fully --.

Column 6,
Line 4, "to the oscillation a amplitude" should read -- to the oscillation amplitude --.

Signed and Sealed this

Third Day of December, 2002

JAMES E. ROGAN
*Director of the United States Patent and Trademark Office*